US008723403B2

(12) United States Patent
Sun et al.

(10) Patent No.: US 8,723,403 B2
(45) Date of Patent: May 13, 2014

(54) LIGHT ASSEMBLY WITH LIGHT-MIXING FUNCTION

(75) Inventors: Ching-Cherng Sun, Taoyuan County (TW); Yu-Yu Chang, Kaohsiung (TW); Chih-Yu Chiu, New Taipei (TW)

(73) Assignee: National Central University, Taoyuan County (TW)

( * ) Notice: Subject to any disclaimer, the term of this patent is extended or adjusted under 35 U.S.C. 154(b) by 51 days.

(21) Appl. No.: 13/541,647

(22) Filed: Jul. 3, 2012

(65) Prior Publication Data

US 2013/0300279 A1 Nov. 14, 2013

(30) Foreign Application Priority Data

May 9, 2012 (TW) ............................. 101116565 A

(51) Int. Cl.
*H01L 33/50* (2010.01)

(52) U.S. Cl.
USPC ........... 313/110; 313/501; 313/111; 313/487; 362/84; 362/231

(58) Field of Classification Search
USPC ................. 313/498–512, 483–487, 110–113; 362/84, 231; 349/65, 71
See application file for complete search history.

(56) References Cited

U.S. PATENT DOCUMENTS

| | | | | |
|---|---|---|---|---|
| 7,819,539 | B2 * | 10/2010 | Kim et al. | 362/84 |
| 8,162,506 | B2 * | 4/2012 | Wei et al. | 362/231 |
| 8,449,129 | B2 * | 5/2013 | Harbers et al. | 362/84 |
| 2008/0231162 | A1 * | 9/2008 | Kurihara et al. | 313/487 |
| 2011/0164402 | A1 * | 7/2011 | Kang et al. | 362/97.2 |
| 2012/0249925 | A1 * | 10/2012 | Yang | 349/65 |

* cited by examiner

*Primary Examiner* — Mariceli Santiago

(57) ABSTRACT

A light assembly with light-mixing function includes a case having an assembling room defined therein and an assembling opening at a top thereof, the assembling opening communicating with the assembling room, a light-mixing sheet sealing the assembling opening of the case, the light-mixing sheet having at least one array set defined thereon, the array set having a plurality of fillisters uniformly defined on the light-mixing sheet, a volume of mixed chemical compound is entered into each fillister, at least one light source electrically set on a bottom of the assembling room. Under this arrangement, when the light assembly with light-mixing function is turned on, a plurality of light beams from the light source is caged in the mixed chemical compounds of the fillisters; and the mixed chemical compound shifts a wavelength of each of the light beams which are caged in the mixed chemical compounds.

8 Claims, 8 Drawing Sheets

LIGHT ASSEMBLY WITH LIGHT-MIXING FUNCTION

BACKGROUND OF THE INVENTION

1. Field of the Invention

The present invention relates to a light assembly, and more particularly to a light assembly with light-mixing function.

2. Description of Related Art

Recently, a light assembly is widely used to illuminate instead of natural light, so that how to increase a CRI (Color Rendering Index) of a wavelength of each light beam from the light assembly is very important for manufactures. The manufacture commonly mixes light beams with different wavelengths (as different colors) into a desired light beam within a certain wavelength range which has a higher CRI. For example, the manufacture mixes a red light beam, a green light beam and a blue light beam into a white light beam which has a higher CRI. Therefore, a conventional light assembly with light-mixing function comes to the world.

The conventional light assembly with light-mixing function comprises a case, a red light source, a green light source, a blue light source, a light-mixing cover and a transparent sheet. The case has a receiving room defined therein. The red light source, the green light source and the blue light source are all electrically set on a bottom of the receiving room. The light-mixing cover covers the red light source, the green light source and the blue light source on the bottom of the receiving room. The transparent sheet seals an opening of the receiving room. Under this arrangement, when the conventional light assembly with light-mixing function is turned on, a red light beam from the red light source, a green light beam from the green light source and a blue light beam from the blue light source are mixed by the light-mixing cover into a white light beam toward the transparent sheet; and then the white light beam from the light-mixing cover passes through the transparent sheet toward the outside relative to the conventional light assembly with light-mixing function so as to illuminate. However, the conventional light assembly with light-mixing function still has two disadvantages as following:

First, in order to create the white light beam with the higher CRI, the manufacture must prepare the red light source, the green light source and the blue light source. Therefore, a cost of the conventional light assembly with light-mixing function is much higher than a light assembly without light-mixing function, or more specifically, a single light source.

Second, after the white light beam from the light-mixing cover passes through the transparent sheet of the conventional light assembly with light-mixing function, the energy of the white light beam is reduced because of the transparent sheet. Therefore, the illumination of the white light beam from the conventional light assembly with light-mixing function is reduced by the transparent sheet of the conventional light assembly with light-mixing function.

The present invention has arisen to mitigate and/or obviate the disadvantages of the conventional.

SUMMARY OF THE INVENTION

The main objective of the present invention is to provide an improved light assembly.

To achieve the objective, a light assembly with light-mixing function comprises a case having an assembling room defined therein and an assembling opening at a top thereof, the assembling opening communicating with the assembling room, a light-mixing sheet sealing the assembling opening of the case, the light-mixing sheet having at least one array set defined thereon, the array set having a plurality of fillisters uniformly defined on the light-mixing sheet, a volume of mixed chemical compound is entered into each fillister, at least one light source electrically set on a bottom of the assembling room. Wherein, the light-mixing sheet is made of a glass material, an acrylic material or a paper material; the fillister is formed as cubic shape or cylinder shape; the fillisters are alternately arranged on the top and bottom light-mixing sheet; the mixed chemical compound is made of fluorescent powder or quantum dot; the mixed chemical compound shifts the wavelength from the blue light beam to a yellow light beam, a red light beam, an orange light beam or a green light beam; the color of the mixed chemical compound of each fillister is selectable; the wavelength of the blue light beam from the light source is 350 nm~470 nm; at least one reflector is assembled on an inner periphery wall of the case, so that when the light beams from the light source are transmitted to the inner periphery wall of the case, the reflector on the inner periphery wall reflects the light beams toward the light-mixing sheet.

Under this arrangement, when the light assembly with light-mixing function is turned on, a plurality of light beams from the light source is transmitted toward the light-mixing sheet; and then the partial light beams pass through the light-mixing sheet directly; on the other hand, the rest light beams are caged in the mixed chemical compounds of the fillisters, and the mixed chemical compound shifts a wavelength of each of the light beams which are caged in the mixed chemical compounds; thereafter, the shifted light beams are emitted from the mixed chemical compound of each fillister; finally, the all of the light beams are mixed together to generate a desired light beams within a desired wavelength range.

Further benefits and advantages of the present invention will become apparent after a careful reading of the detailed description with appropriate reference to the accompanying drawings.

BRIEF DESCRIPTION OF THE DRAWINGS

FIG. 3 is a top plan view of a light-mixing sheet when the light source is turned on;

DETAILED DESCRIPTION OF THE INVENTION

Figure 1:
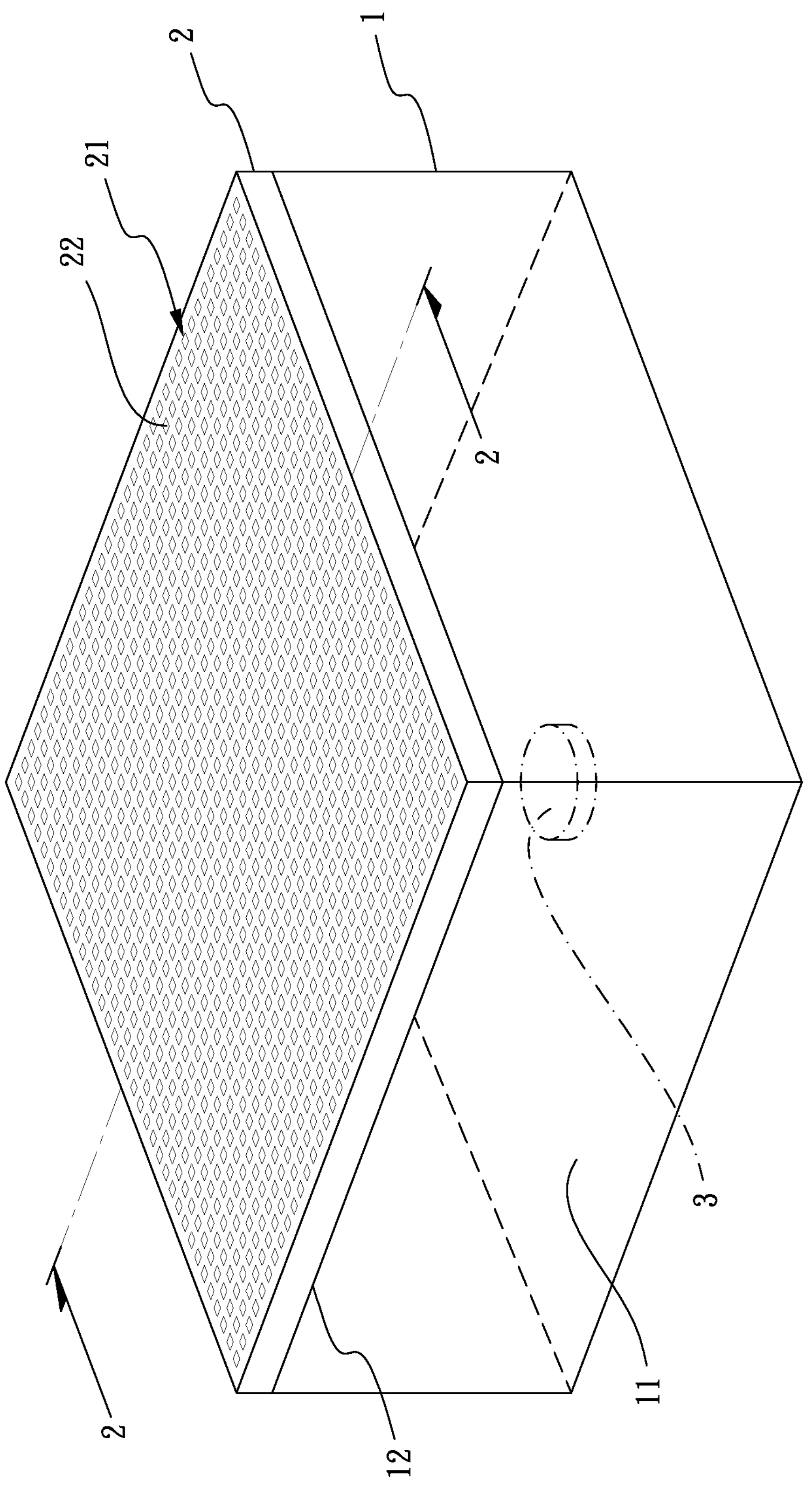
FIG. 1 is a perspective view of a light assembly with light-mixing function of the first embodiment of the present invention.
Figure 2:
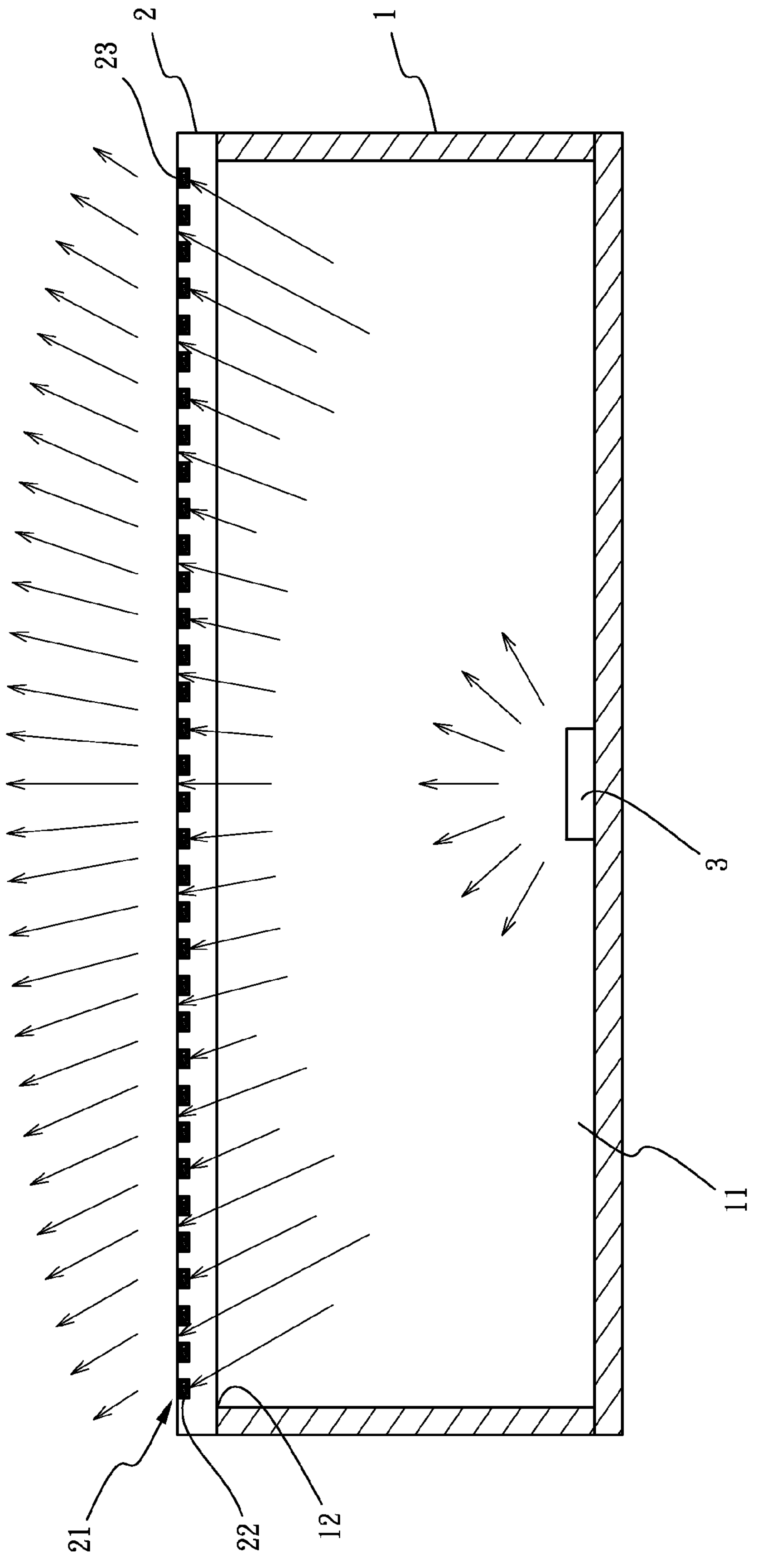
FIG. 2 is a cross-sectional view along a line 2-2 in FIG. 1 for showing a plurality beams from a light source.

Referring to FIGS. 1-2, the first embodiment is shown as following. A light assembly with light-mixing function in accordance with the present invention comprises a case 1, a light-mixing sheet 2 and at least one light source 3. An assembling room 11 is defined in the case 1. The case 1 has an assembling opening 12 at a top thereof. The assembling opening 12 communicates with the assembling room 11. The light source 3 is electrically set on a bottom of the assembling room 11. The light-mixing sheet 2 seals the assembling opening 12 of the case 1. The light-mixing sheet 2 has at least one array set 21 defined on a top surface thereof. The array set 21 has a plurality of fillisters 22 uniformly defined on the top surface of the light-mixing sheet 2 (each fillister 22 is formed as cubic shape in this embodiment, but the shape of each fillister 22 is not limited in the present invention, i.e. each fillister 22 could be formed as cylinder shape or other shape). A volume of mixed chemical compound 23 is entered into each fillister 22. The above description is enough to perform the priority embodiment of the present invention.

Under this arrangement, when the light assembly with light-mixing function is turned on, a plurality of light beams from the light source 3 is transmitted toward the light-mixing sheet 2; and then the partial light beams pass through the light-mixing sheet 2 directly; on the other hand, the rest light beams are caged in the mixed chemical compounds 23 of the fillisters 22, and the mixed chemical compound 23 shifts a wavelength of each of the light beams which are caged in the mixed chemical compounds 23; thereafter, the shifted light beams are emitted from the mixed chemical compound 23 of each fillister 22; finally, the all of the light beams are mixed together to generate a desired light beams within a desired wavelength range.

Figure 4:
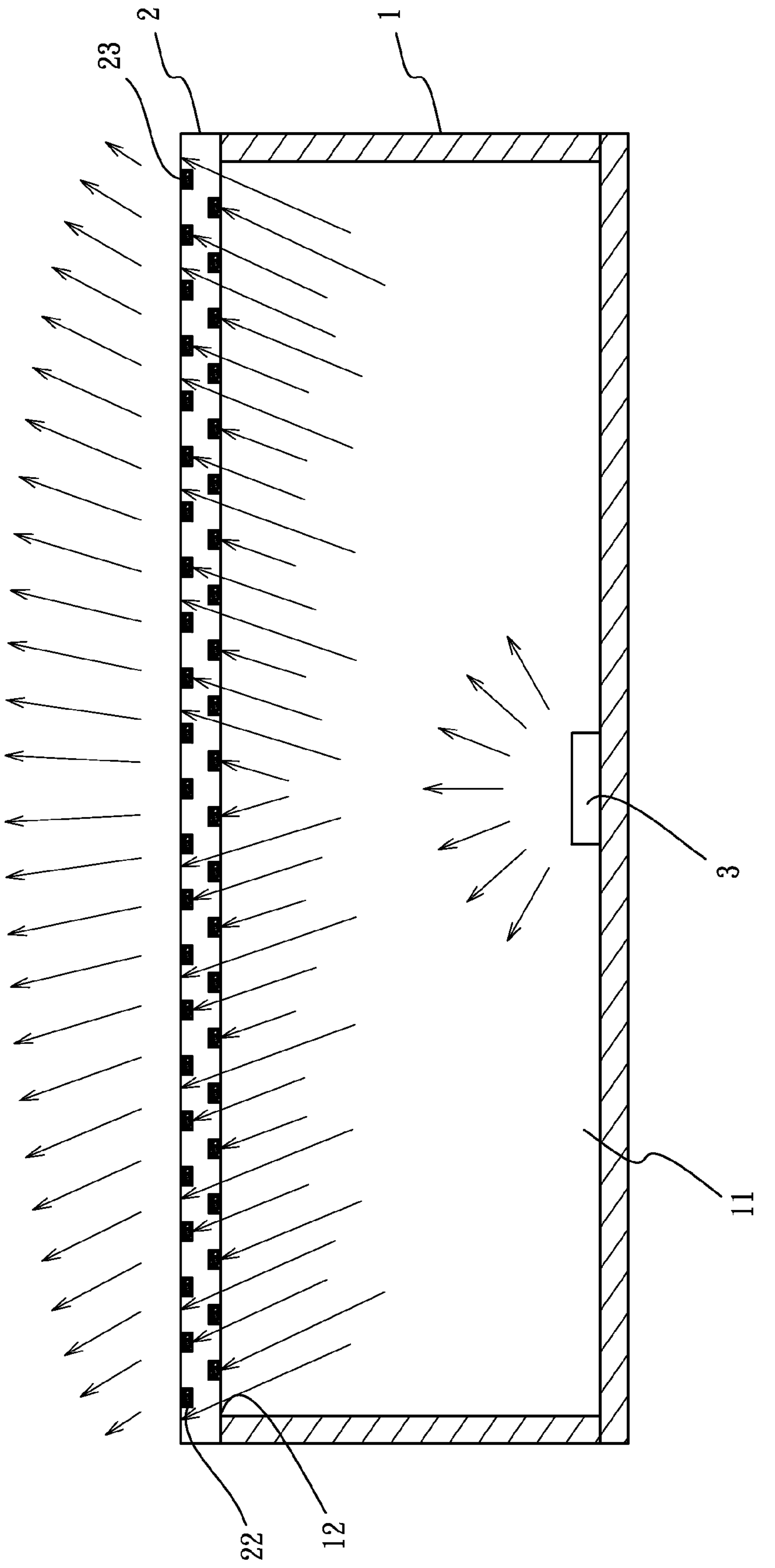
FIG. 4 is a cross-sectional view for showing the second embodiment.

Referring to FIG. 4, the second embodiment is shown as following (only the features being different from the first embodiment are further described). A light-mixing sheet 2 has two array sets 21. One array set 21 is defined on a top surface of the light-mixing sheet 2 and another array set 21 is defined on a bottom surface of the light-mixing sheet 2. Two array sets 21 respectively have a plurality of fillisters 22 which are uniformly defined on the top and bottom surface of the light-mixing sheet 2. The fillisters 22 are alternately arranged on the top and bottom light-mixing sheet 2.

Figure 5:
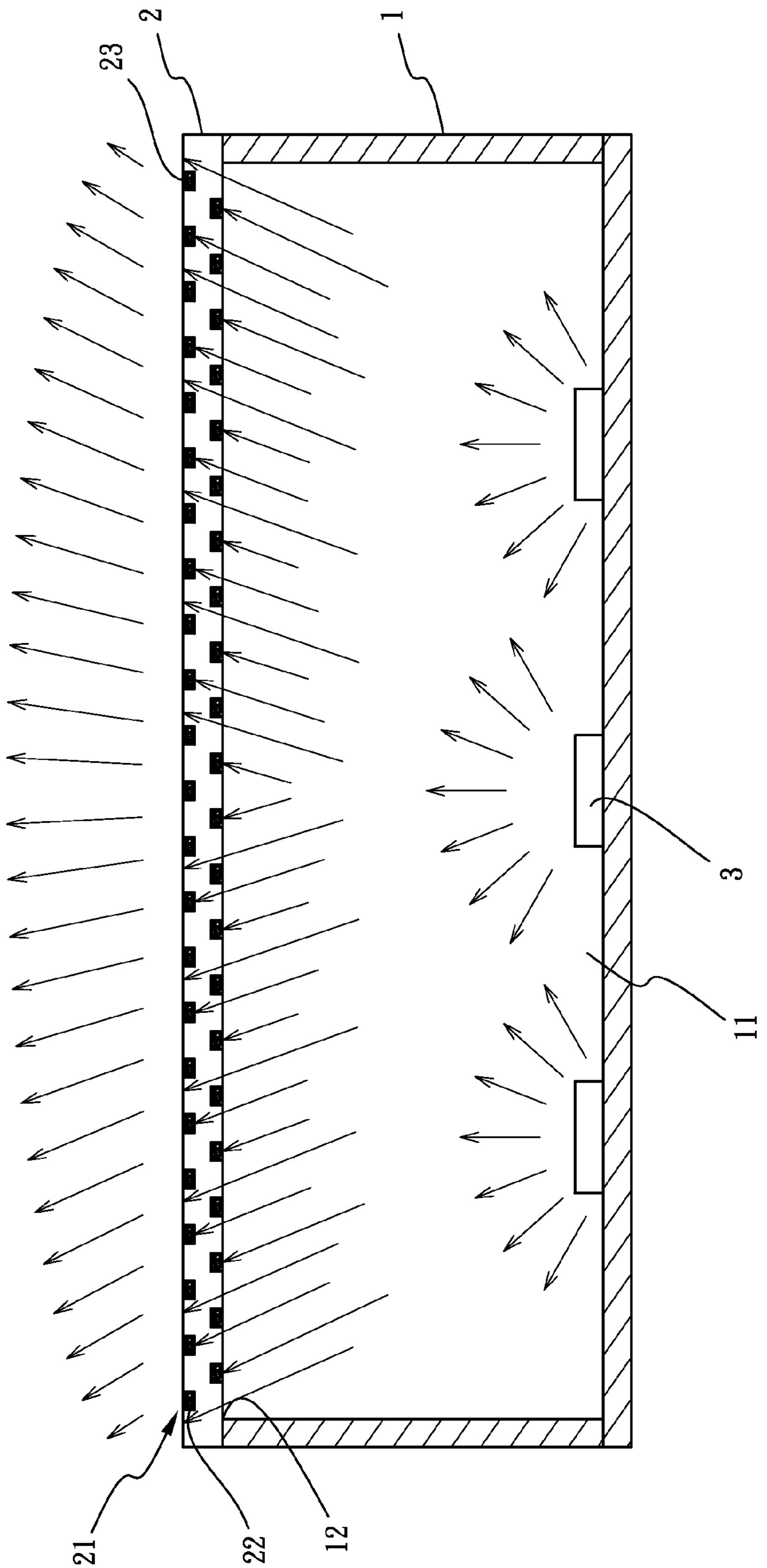
FIG. 5 is a cross-sectional view for showing the third embodiment.

Referring to FIG. 5, the third embodiment is shown as following (only the features being different from the second embodiment are further described). Three light sources 3 are electrically set on the bottom of the assembling room 11. Therefore, the illumination of the light assembly with light-mixing function in the third embodiment is better than the illumination of the light assembly with light-mixing function in the first or second embodiment which has one light source 3.

Figure 8:
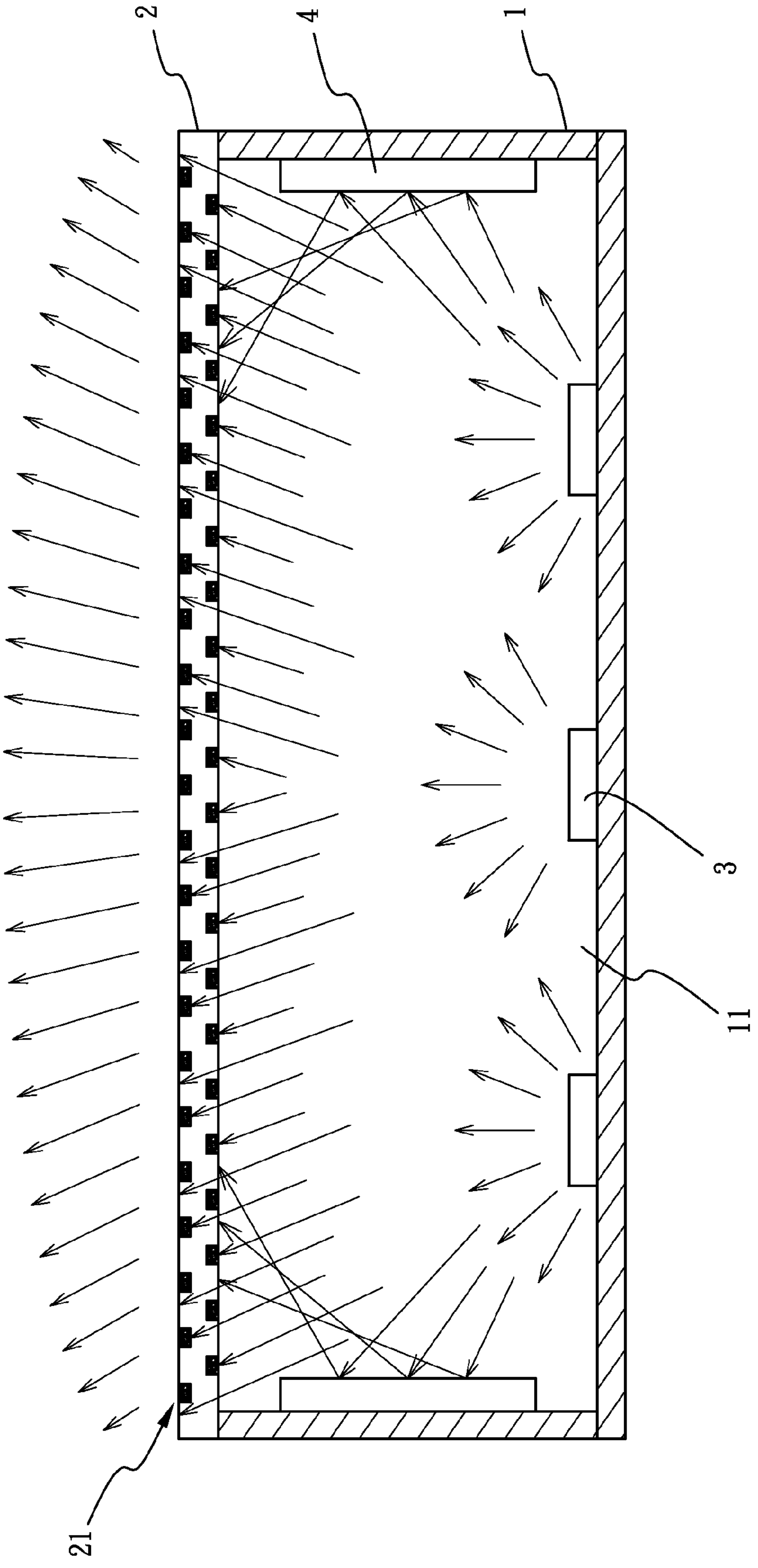
FIG. 8 is a cross-sectional view for showing the fourth embodiment.

Referring to FIG. 8, the fourth embodiment is shown as following (only the features being different from the third embodiment are further described). At least one reflector 4 is assembled on an inner periphery wall of the case 1. Under this arrangement, when the light beams from the light source 3 are transmitted to the inner periphery wall of the case 1, the reflector 4 on the inner periphery wall reflects the light beams toward the light-mixing sheet 2. Therefore, the light beams which are transmitted to the inner periphery wall of the case 1 are reflected toward the light-mixing sheet 2 rather than be absorbed by the inner periphery wall of the case 1.

Furthermore, the light-mixing sheet 2 is made of a glass material so that the light beams from the light source 3 can pass through the light-mixing sheet 2 (the material of the light-mixing sheet 2 is not limited by the present invention, i.e. the light-mixing sheet 2 might be made of an acrylic material or a paper material . . . etc.). The mixed chemical compound 23 is made of fluorescent powder (or quantum dots) which can shift the wavelength of the light beam from the light source 3 according to the color (or the chemical property) thereof. The color (or the chemical property) of the mixed chemical compound 23 of each fillister 21 is selectable.

Figure 3:
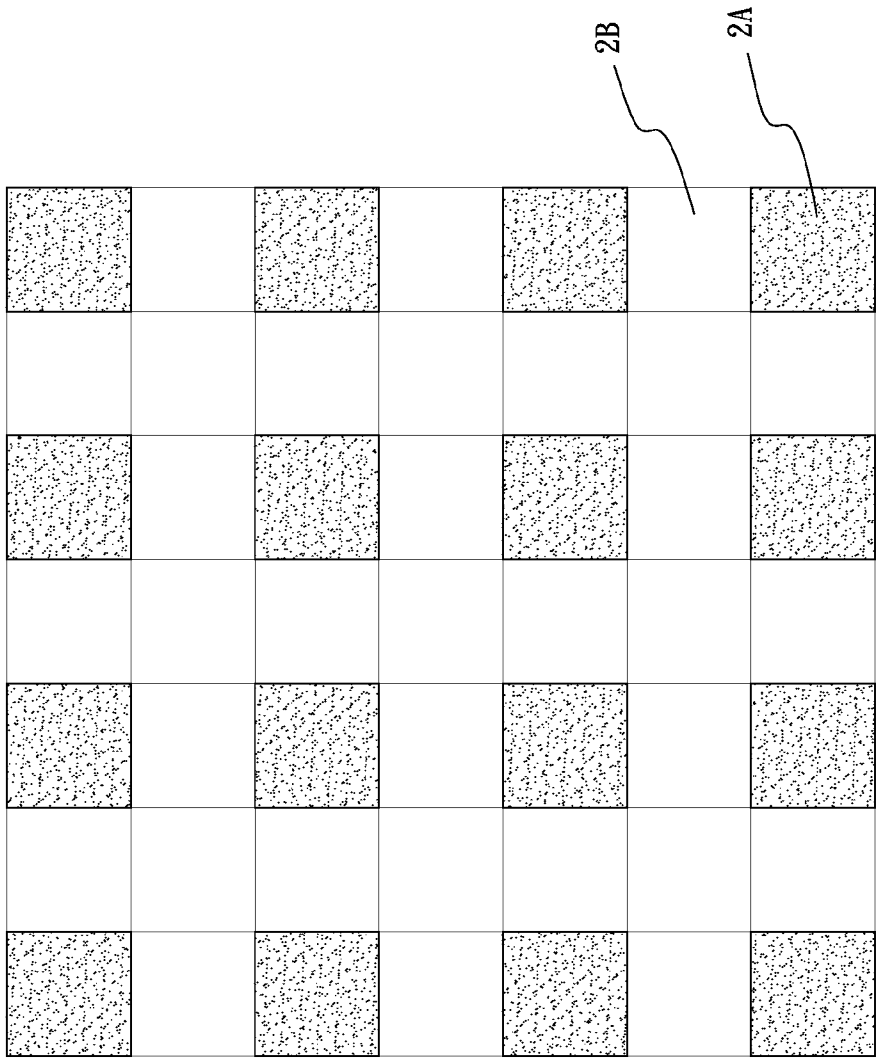

Referring to the first embodiment of the present invention, the wavelength of the light beam from the light source 3 in the present invention is 350 nm~470 nm (as blue color). When the blue light beam from the light source 3 is transmitted into the mixed chemical compound 23 which generates a yellow light beams, the mixed chemical compound 23 shifts the wavelength from the blue light beam to the yellow light beam. Thus, the blue light beam is mixed with the yellow light beam into a whit light beam. In addition, the blue light beam and the yellow light beam respectively define the light-mixing sheet 2 as a blue area 2B and a yellow area 2A (as shown in FIG. 3).

Figure 6:
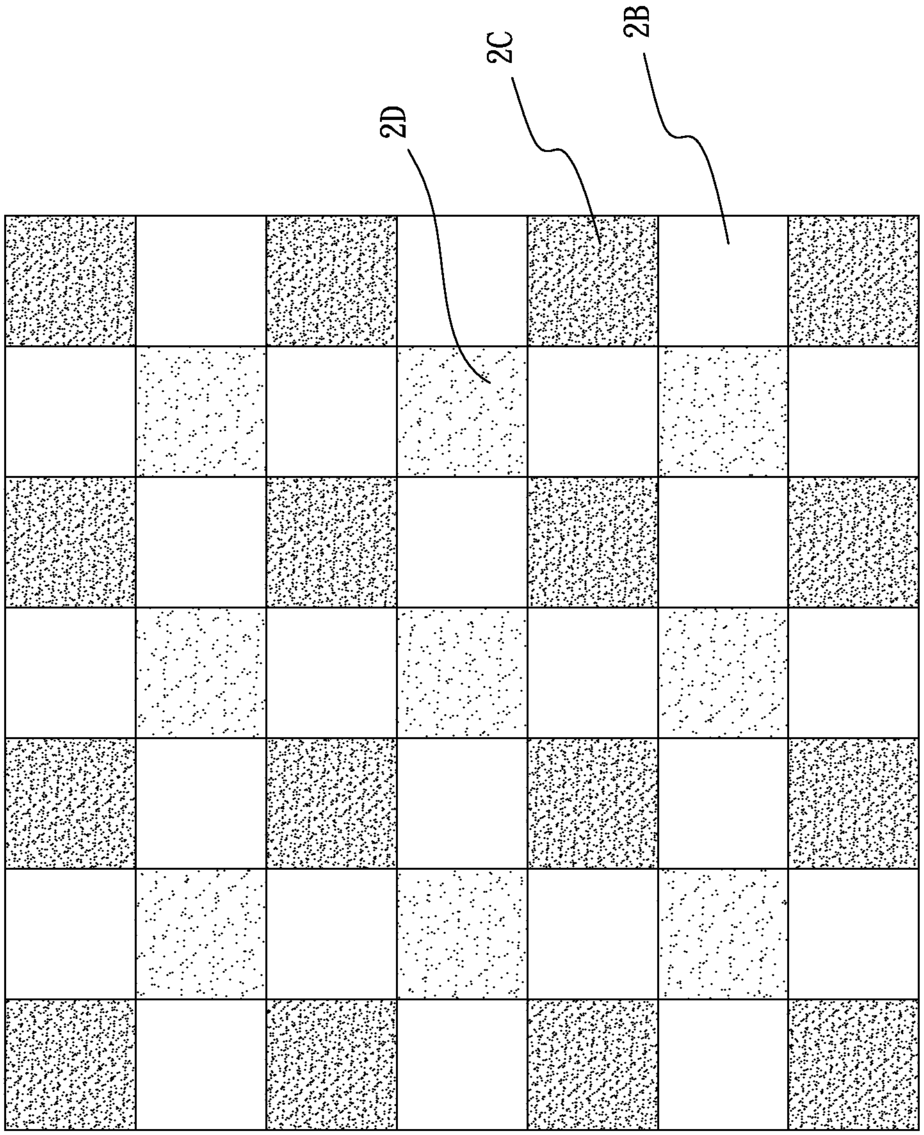
FIG. 6 is a top plan view of the light-mixing sheet when the light source is turned on in the second or third embodiment.

Referring to the second to fourth embodiment of the present invention, the mixed chemical compound 23 made of the fluorescent powder which generates the orange light beams is entered into each fillister 22 of one array set 21 on the top surface of the light-mixing sheet 2. The mixed chemical compound 23 made of the fluorescent powder which generates the green light beams is entered into each further fillister 22 of another array set 21 on the bottom surface of the light-mixing sheet 2. When the blue light beam from the light source 3 is transmitted into the mixed chemical compound 23 which generates the orange light beams, the mixed chemical compound 23 shifts the wavelength from the blue light beam to the orange light beam; when the blue light beam from the light source 3 is transmitted into the mixed chemical compound 23 which generates the green light beams, the mixed chemical compound 23 shifts the wavelength from the blue light beam to the green light beam. Thus, the blue light beam is mixed with the orange light beam and the yellow light beam into a whit light beam. In addition, the blue light beam, the orange light beam and the green light beam respectively define the light-mixing sheet 2 as a blue area 2B, a orange area 2C and a green area 2D (as shown in FIG. 6). Furthermore, the fillisters 22 are alternately arranged on the top and bottom surface light-mixing sheet 2, so that the light beam from the fillister 22 on the bottom surface of the light-mixing sheet 2 would not be transmitted into the fillisters 22 on the top surface of the light-mixing sheet 2, but be passing through the light-mixing sheet 2 directly. Therefore, the wavelength of each shifted light beam from the light-mixing sheet 2 function is shifted once rather than be shifted twice.

Figure 7:
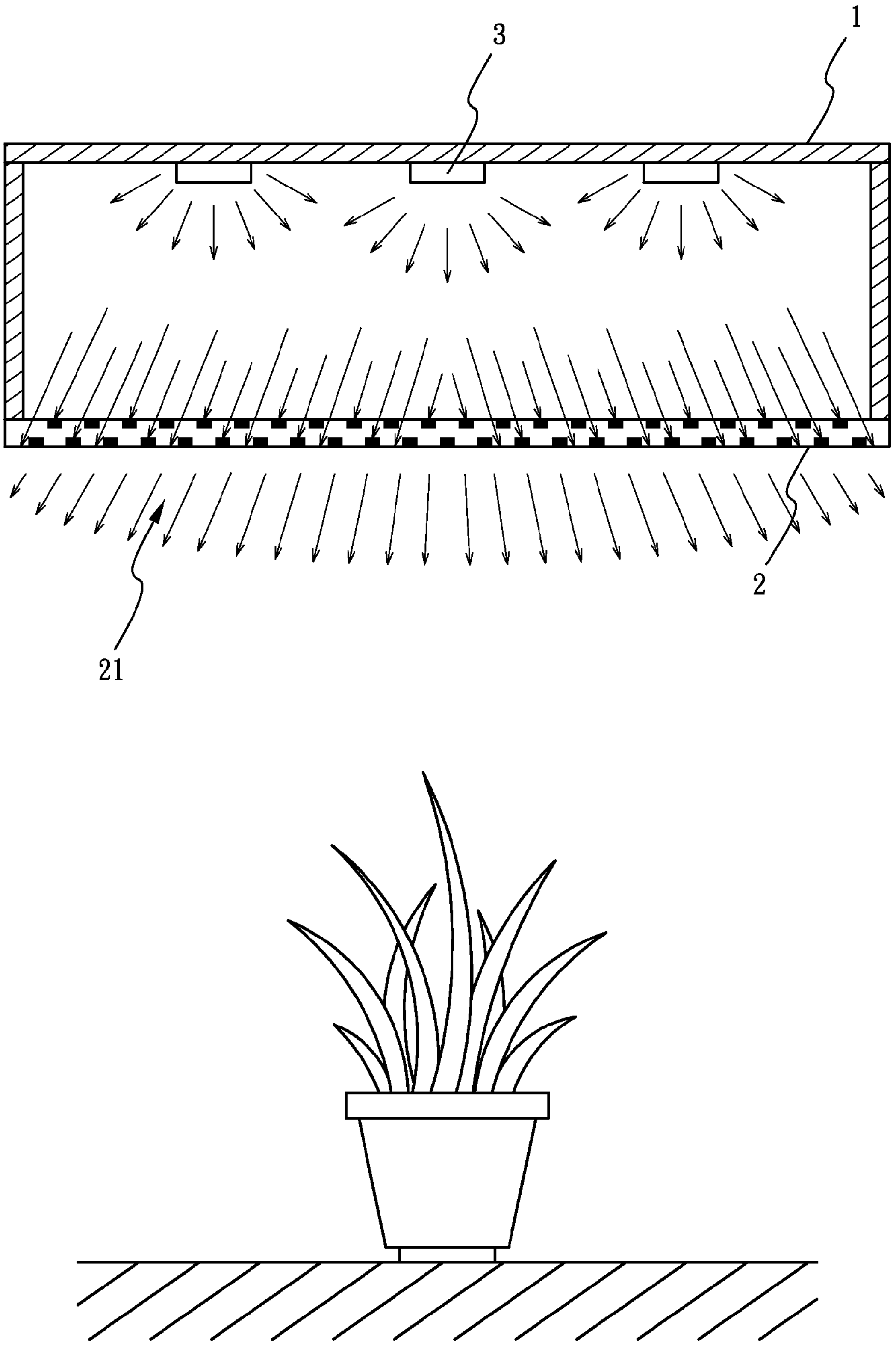
FIG. 7 is a side view for showing the light assembly with light-mixing function, which is illuminating a botanical garden.

Referring to FIG. 7, the present invention is further used to illuminate a botanical garden. The mixed chemical compound 23 generates the red light beams. When the blue light beam from the light source 3 is transmitted into the chemical compound 23 which generates the red light beams, the mixed chemical compound 23 shifts the wavelength from the blue light beam to the red light beam. Thus, the blue light beam is mixed with the red light beam into a further light beam which is suitable to illuminate the botanical garden.

All in all, the light assembly with light-mixing function of the present invention has only one light source 3 rather than has three light source 3 (the red light source, the green light source and the blue light source) as the prior art, so that a cost of the light assembly with light-mixing function of the present invention is much lower than the prior art. After the white light beam passes through the light-mixing sheet 2, the white light beam is transmitted toward the outside relative to the light assembly with light-mixing function of the present invention rather than is transmitted toward a further transparent sheet as the prior art, so that energy of the white light beam would not be reduced by the further transparent sheet as the prior art.

Although the invention has been explained in relation to its preferred embodiment, it is to be understood that many other possible modifications and variations can be made without departing from the spirit and scope of the invention as hereinafter claimed.

What is claimed is:

1. A light assembly with light-mixing function comprising:

a case having an assembling room defined therein and an assembling opening at a top thereof, the assembling opening communicating with the assembling room;

a light-mixing sheet sealing the assembling opening of the case, the light-mixing sheet having at least one array set defined thereon, the array set having a plurality of fillisters uniformly defined on the light-mixing sheet, wherein the fillisters are alternately arranged on the top and bottom light-mixing sheet and a volume of mixed chemical compound is entered into each fillister; and at least one light source electrically set on a bottom of the assembling room;

wherein, when the light assembly with light-mixing function is turned on, a plurality of light beams from the light source is transmitted toward the light-mixing sheet; and then the partial light beams pass through the light-mixing sheet directly; on the other hand, the rest light beams are caged in the mixed chemical compounds of the fillisters, and the mixed chemical compound shifts a wavelength of each of the light beams which are caged in the mixed chemical compounds; thereafter, the shifted light beams are emitted from the mixed chemical compound of each fillister; finally, the all of the light beams are mixed together to generate a desired light beams within a desired wavelength range.

2. The light assembly with light-mixing function as claimed in claim 1, wherein the light-mixing sheet is made of a glass material, an acrylic material or a paper material.

3. The light assembly with light-mixing function as claimed in claim 1, wherein the fillister is formed as cubic shape or cylinder shape.

4. The light assembly with light-mixing function as claimed in claim 1, wherein the mixed chemical compound is made of fluorescent powder or quantum dot.

5. The light assembly with light-mixing function as claimed in claim 4, wherein the mixed chemical compound shifts the wavelength from the blue light beam to a yellow light beam, a red light beam, an orange light beam or a green light beam.

6. The light assembly with light-mixing function as claimed in claim 4, wherein the color of the mixed chemical compound of each fillister is selectable.

7. The light assembly with light-mixing function as claimed in claim 1, wherein the wavelength of the blue light beam from the light source is 350 nm-470 nm.

8. The light assembly with light-mixing function as claimed in claim 1, wherein at least one reflector is assembled on an inner periphery wall of the case, so that when the light beams from the light source are transmitted to the inner periphery wall of the case, the reflector on the inner periphery wall reflects the light beams toward the light-mixing sheet.

* * * * *